(12) United States Patent
Sugino et al.

(10) Patent No.: US 11,422,197 B2
(45) Date of Patent: Aug. 23, 2022

(54) BATTERY SYSTEM

(71) Applicants: TOYOTA JIDOSHA KABUSHIKI KAISHA, Toyota (JP); DENSO CORPORATION, Kariya (JP)

(72) Inventors: Yoshiki Sugino, Seto (JP); Yoshihiro Uchida, Nagakute (JP); Tetsuya Watanabe, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 17/124,950

(22) Filed: Dec. 17, 2020

(65) Prior Publication Data
US 2021/0190871 A1 Jun. 24, 2021

(30) Foreign Application Priority Data
Dec. 23, 2019 (JP) .............................. JP2019-231558

(51) Int. Cl.
*G01R 31/389* (2019.01)
*G01R 31/3842* (2019.01)
*H02J 7/14* (2006.01)

(52) U.S. Cl.
CPC ....... *G01R 31/389* (2019.01); *G01R 31/3842* (2019.01); *H02J 7/143* (2020.01); *H02J 7/1423* (2013.01)

(58) Field of Classification Search
None
See application file for complete search history.

(56) References Cited

U.S. PATENT DOCUMENTS

2006/0066285 A1* 3/2006 Minamiura ........... H02J 7/0047
320/132

FOREIGN PATENT DOCUMENTS

JP 2005-156352 A 6/2005

* cited by examiner

*Primary Examiner* — Jas A Sanghera
(74) *Attorney, Agent, or Firm* — Sughrue Mion, PLLC

(57) ABSTRACT

A battery system includes a controller that performs a calculation to calculate an internal resistance of a battery, and executes a predetermined operation based on the result. The calculation includes obtaining a regression line through a regression analysis of a current-voltage plot obtained from voltage sensor and current sensor, and calculating the internal resistance from a slope of the regression line. The controller calculates a first internal resistance through the calculation based on a first group of detection values of the voltage and current detected a plurality of times, and calculate a second internal resistance through the calculation based on a second group of detection values. The controller executes the predetermined operation when a resistance difference between the first and second internal resistances is smaller than a reference value, and does not execute the operation when the resistance difference is larger than the reference value.

4 Claims, 9 Drawing Sheets

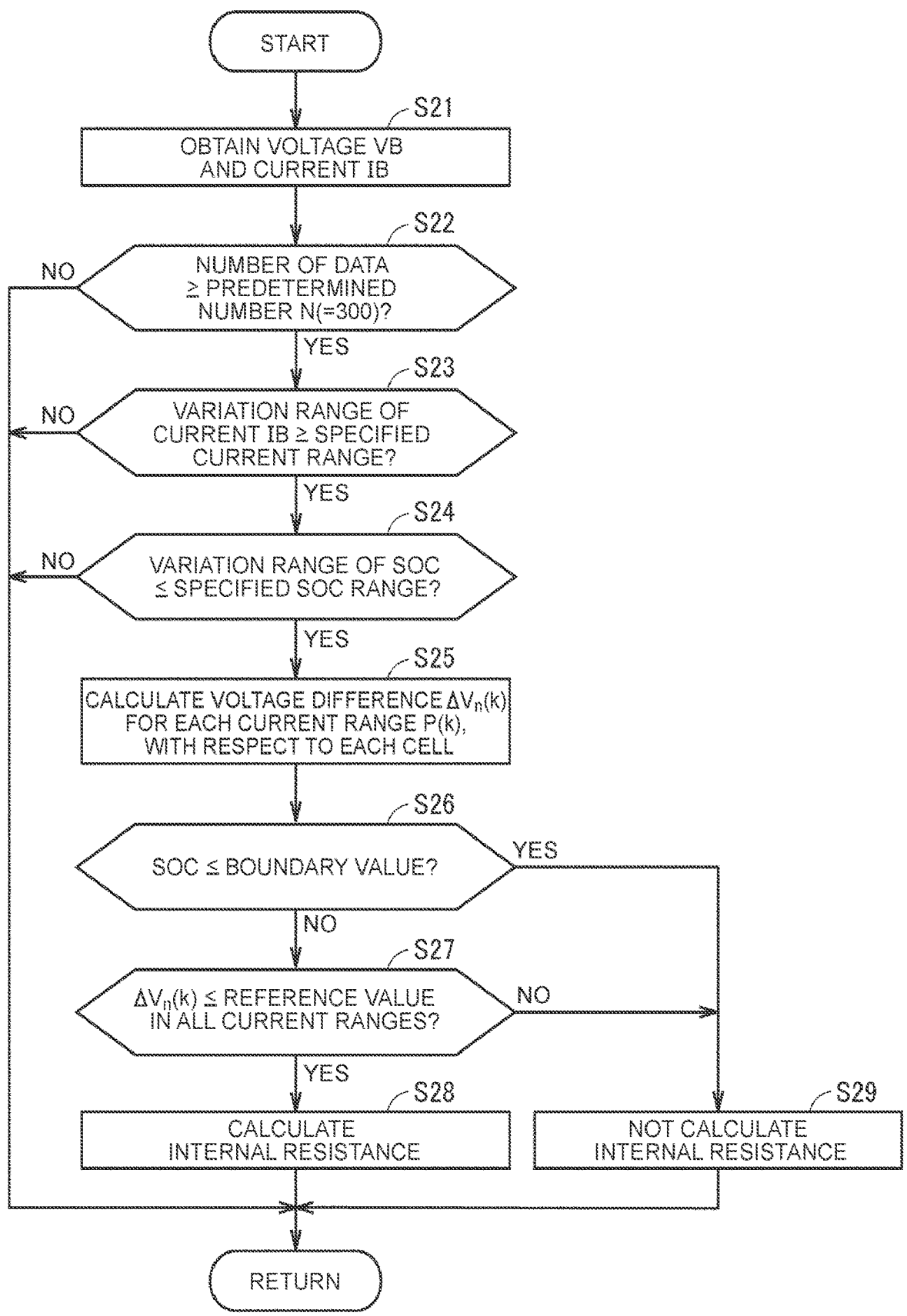

BATTERY SYSTEM

INCORPORATION BY REFERENCE

The disclosure of Japanese Patent Application No. 2019-231558 filed on Dec. 23, 2019 including the specification, drawings and abstract is incorporated herein by reference in its entirety.

BACKGROUND

1. Technical Field

The disclosure relates to a battery system, and more particularly to a technology of calculating the internal resistance of a battery.

2. Description of Related Art

There is a demand for a technology of calculating the internal resistance of a battery with high accuracy. By calculating the internal resistance of the battery with high accuracy, it becomes possible to appropriately execute operation based on the calculation result of the internal resistance of the battery. For example, highly accurate calculation of the internal resistance of the battery makes it possible to detect a temperature rise in the battery (such as abnormal heat generation in the battery) due to the Joule heat generated in the battery. In another example, highly accurate calculation of the internal resistance of the battery makes it possible to calculate the open circuit voltage (OCV) of the battery with high accuracy.

When large current is drawn out of a battery in a short period of time, the internal resistance is likely to increase as discharge current rapidly increases, as described in Japanese Unexamined Patent Application Publication No. 2005-156352 (JP 2005-156352 A). In this case, a region where no linearity is observed in the I-V plot (I-V characteristics) may appear in a high current region. According to JP 2005-156352 A, the OCV can be calculated with high accuracy, even when no linearity is observed in the I-V plot of the battery.

SUMMARY

In a computation method disclosed in JP 2005-156352 A, a current range of discharge current of the battery is divided into at least two current ranges according to the magnitude of the current value. Further, regression analysis is performed based on current-voltage sampling data obtained (synchronously detected) in a low current range having low current values, among a plurality of current ranges, and current-voltage sampling data synchronously detected in a current range (high current range) in which discharge current is included. Then, the internal resistance (virtual internal resistance) corresponding to the current range of discharge current is calculated, from the slope of a regression line obtained through the regression analysis.

The linearity is eliminated from the I-V plot of the battery, namely, the I-V plot becomes non-linear, due to various factors. Since the factors are not sufficiently studied, in the computation method disclosed in JP 2005-156352 A, the internal resistance may not be accurately calculated. As a result, operation (such as calculation of the OCV) based on the calculation result of the internal resistance may not be performed with high accuracy.

This disclosure provides a battery system that appropriately executes operation based on the calculation result of the internal resistance of a battery. With the battery system of the disclosure, the internal resistance of the battery can be calculated with improved accuracy.

A battery system according to a first aspect of the disclosure includes a battery, a voltage sensor configured to detect a voltage of the battery, a current sensor configured to detect a current that passes through the battery, and a controller configured to perform internal resistance calculation to calculate an internal resistance of the battery, and configured to execute a predetermined operation based on a result of the internal resistance calculation. The internal resistance calculation comprises obtaining a regression line through a regression analysis of a current-voltage plot obtained from the voltage sensor and the current sensor, and calculating the internal resistance from a slope of the regression line. The controller is configured to calculate a first internal resistance through the internal resistance calculation based on a first detection group of detection values of the voltage and the current that are detected a plurality of times, and calculate a second internal resistance through the internal resistance calculation based on a second detection group of detection values of the voltage and the current that are detected a plurality of times. The controller is configured to execute the predetermined operation when a resistance difference between the first internal resistance and the second internal resistance is smaller than a reference value, and is configured not to execute the predetermined operation when the resistance difference is larger than the reference value.

In the first aspect as described above, the controller determines whether the predetermined operation based on the result of the internal resistance calculation is executed, depending on the resistance difference between the first internal resistance and second internal resistance of the battery. When the resistance difference is smaller than the reference value, the predetermined operation is executed, because variation in the resistance difference due to an influence of characteristic deterioration which will be described later is supposed to be small, and the calculation accuracy of the internal resistance of the battery is supposed to be high. On the other hand, when the resistance difference is larger than the reference value, the predetermined operation is not executed, because variation in the resistance difference due to an influence of characteristic deterioration is supposed to be large, and the calculation accuracy of the internal resistance of the battery is supposed to be low. Thus, with the configuration of the first aspect, the predetermined operation can be appropriately executed based on the calculation result of the internal resistance of the battery.

A battery system according to a second aspect of the disclosure includes a battery, a voltage sensor configured to detect a voltage of the battery, a current sensor configured to detect a current that passes through the battery, and a controller configured to perform internal resistance calculation to calculate an internal resistance of the battery. The internal resistance calculation comprises obtaining a regression line through a regression analysis of a current-voltage plot obtained from the voltage sensor and the current sensor, and calculating the internal resistance from a slope of the regression line. The controller is configured to calculate a voltage difference between a maximum voltage and a minimum voltage, out of voltages detected a plurality of times, with respect to each of a plurality of current ranges in the current-voltage plot. The controller is configured to perform the internal resistance calculation when the voltage difference is smaller than a reference value in all of the current ranges, and is configured not to perform the internal resistance calculation when the voltage difference is larger than the reference value in any of the current ranges.

In the second aspect as described above, the controller determines whether the internal resistance calculation is performed, depending on a voltage difference for each of the current ranges. When the voltage difference is smaller than the reference value in all of the current ranges, the internal resistance calculation is performed, since variation in the resistance difference due to an influence of characteristic deterioration is supposed to be small. On the other hand, when the voltage difference is larger than the reference value in any of the current ranges, the internal resistance calculation is not performed, since variation in the resistance difference due to the influence of characteristic deterioration is supposed to be large. Thus, with the configuration of the second aspect, the calculation accuracy of the internal resistance of the battery can be improved.

According to this disclosure, the operation based on the calculation result of the internal resistance of the battery can be appropriately performed. Also, according to the disclosure, the calculation accuracy of the internal resistance of the battery can be improved.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 13 is a flowchart illustrating an internal resistance calculation routine in the second embodiment.

DETAILED DESCRIPTION OF EMBODIMENTS

Figure 1:
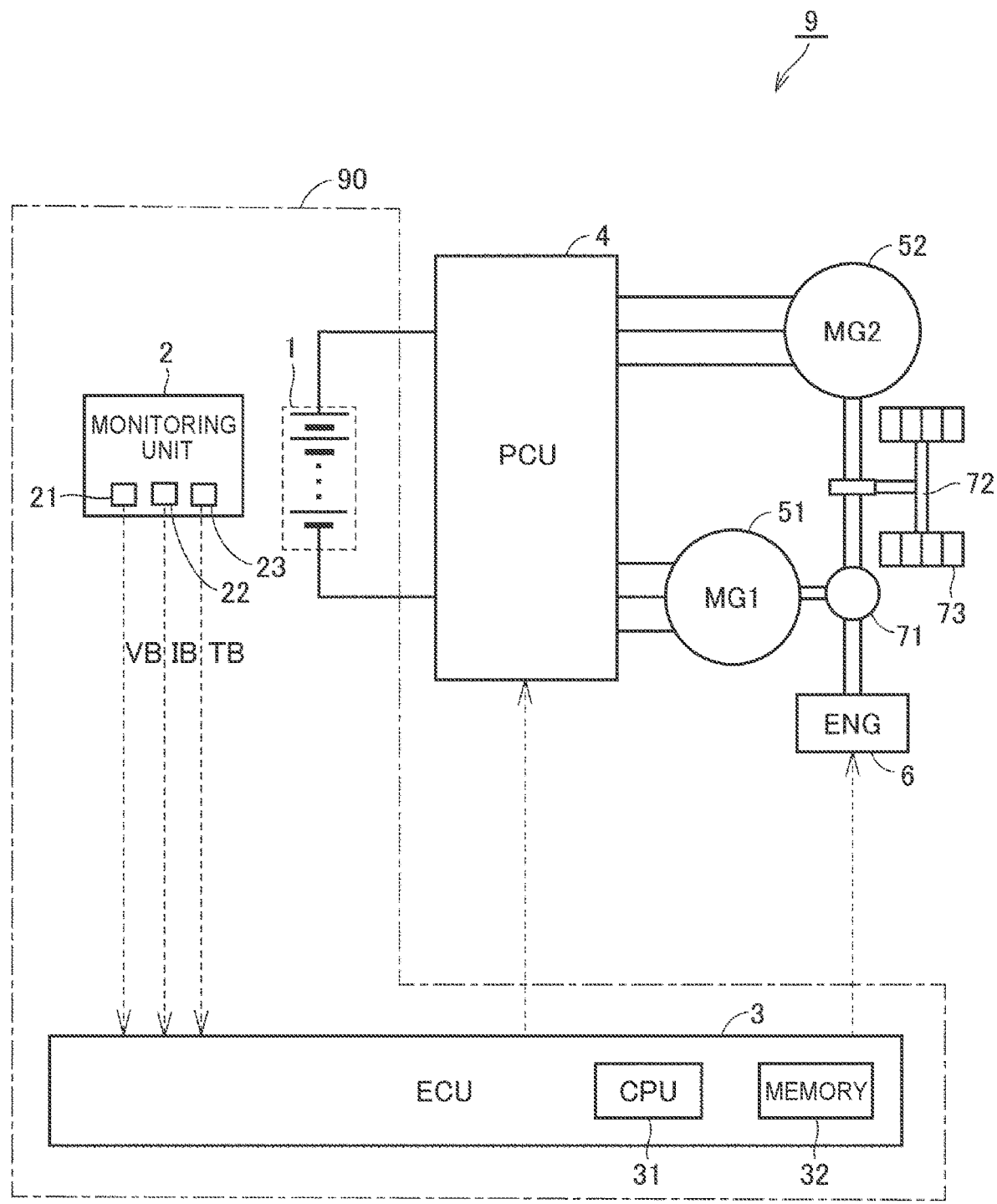
FIG. 1 is a view schematically showing the overall configuration of a vehicle on which a battery system according to a first embodiment is installed.

Some embodiments will be described in detail with reference to the drawings. In the drawings, the same reference signs are assigned to the same or corresponding components or portions, of which description will not be repeated.

In the following embodiments, a battery system according to this disclosure is installed on a vehicle by way of example. However, the battery system according to the disclosure is not limitedly used for a vehicle, but may be a stationary one, for example.

First Embodiment

Configuration of Battery System

FIG. 1 schematically shows the overall configuration of a vehicle on which a battery system according to a first embodiment is installed. Referring to FIG. 1, the vehicle 9 is a hybrid vehicle, for example. However, the vehicle 9 may be a plug-in hybrid vehicle or electric vehicle, provided that a battery for propelling the vehicle is installed on the vehicle.

The vehicle 9 is provided with a battery system 90. The battery system 90 includes a battery 1, monitoring unit 2, and electronic control unit (ECU) 3. The vehicle 9 further has a power control unit (PCU) 4, motor-generators 51, 52, engine 6, power split device 71, drive shaft 72, and drive wheels 73, in addition to the battery system 90.

The battery 1 is a battery pack including a battery assembly. The battery assembly includes a plurality of cells. In this embodiment, each cell is a lithium-ion secondary battery. However, the cells are not limited to this type. Each cell may be another type of secondary battery (such as a nickel hydride battery). The configuration of the battery assembly and each cell will be described in more detail, with reference to FIG. 2 and FIG. 3.

The battery 1 stores electric power for driving the motor-generators 51, 52, and supplies electric power to the motor-generators 51, 52, via the PCU 4. Also, the battery 1 is charged with electric power generated by the motor-generators 51, 52 and received via the PCU 4.

The monitoring unit 2 includes a plurality of voltage sensors 21, current sensor 22, and temperature sensor 23. The voltage sensors 21 are respectively provided for a plurality of cells that constitutes the battery assembly. Each of the voltage sensors 21 detects voltage VB (voltage V1 to V12 that will be described later) of the corresponding cell. The current sensor 22 detects current IB that passes through the battery 1. The temperature sensor 23 detects the temperature TB of the battery 1. Each sensor outputs its detection result to the ECU 3.

The ECU 3 includes a central processing unit (CPU) 31, memory (more specifically, a read-only memory (ROM) and a random access memory (RAM)) 32, and input-output port (not shown) that receives and outputs various signals. The ECU 3 controls the vehicle 9 to bring it into a desired state, based on a signal received from each sensor of the monitoring unit 2, and programs and maps stored in the memory 32. In this embodiment, main processing executed by the ECU 3 includes "internal resistance calculation" for the battery 1, and "abnormality diagnosis" of the battery 1, for example.

The internal resistance calculation for the battery 1 is operation to calculate an internal resistance difference between each pair of the cells 101 to 112 (see FIG. 2) included in the battery 1. The internal resistance calculation will be described in detail later.

The abnormality diagnosis of the battery 1 is operation to determine the presence or absence of an abnormality (more specifically, abnormal heat generation in any cell) of the battery 1, based on the result of the internal resistance calculation. When an internal resistance difference between adjacent two cells of the cells included in the battery 1 is larger than a predetermined value, the ECU 3 determines that there is a possibility of occurrence of an abnormality in the cell having high resistance.

The PCU 4 performs bidirectional conversion of electric power between the battery 1 and the motor-generators 51, 52, according to a control signal from the ECU 3. The PCU 4 is configured to be able to control the states of the motor-generators 51, 52, independently of each other. For example, the PCU 4 can place the motor-generator 52 in a power running state, while placing the motor-generator 51 in a regenerative state (power generating state). The PCU 4 includes two inverters (not shown) corresponding to the motor-generators 51, 52, and a converter (not shown) that boosts direct-current (DC) voltage supplied to each inverter, to a level equal to or higher than the output voltage of the battery 1, for example.

Each of the motor-generators 51, 52 is an alternating-current (AC) rotary electric machine, such as a three-phase AC synchronous motor having a rotor in which permanent magnets are embedded. The motor-generator 51 is mainly used as a generator that is driven by the engine 6 via the power split device 71. Electric power generated by the motor-generator 51 is supplied to the motor-generator 52 or the battery 1, via the PCU 4.

The motor-generator 52 mainly operates as an electric motor, and drives the drive wheels 73. The motor-generator 52 is driven when receiving at least one of the electric power from the battery 1 and the electric power generated by the motor-generator 51, and driving force of the motor-generator 52 is transmitted to the drive shaft 72. In the meantime, when a brake is applied to the vehicle, or the acceleration is reduced on a downhill slope, the motor-generator 52 operates as a generator, and performs regenerative power generation. Electric power generated by the motor-generator 52 is supplied to the battery 1 via the PCU 4.

The engine 6 converts combustion energy generated when a mixture of air and fuel is burned, into kinetic energy of a motion part, such as a piston or rotor, thereby to deliver motive power.

The power split device 71 includes a planetary gear mechanism (not shown) having three rotary shafts, i.e., a sun gear, a carrier and a ring gear, for example. The power split device 71 splits power delivered from the engine 6, into power for driving the motor-generator 51, and power for driving the drive wheels 73.

Battery Configuration

Figure 2:
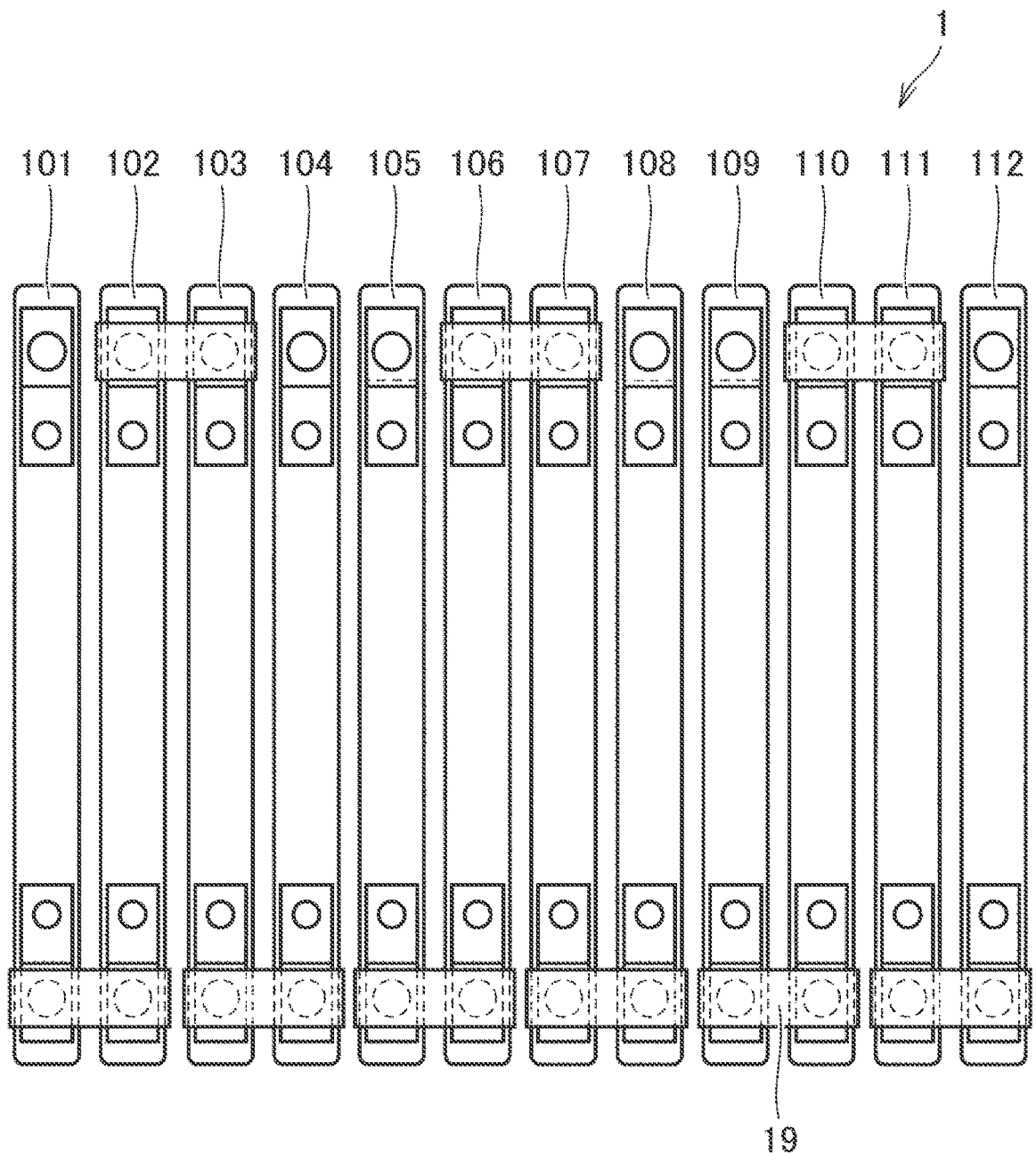
FIG. 2 is a view showing one example of the configuration of a battery assembly included in a battery.

FIG. 2 shows one example of the configuration of the battery assembly included in the battery 1. In the example shown in FIG. 2, the battery assembly includes twelve cells 101 to 112. However, the number of cells included in the battery assembly is not particularly limited, but is typically in a range of about a dozen to several dozens.

The cells 101 to 112 are stacked in the lateral direction in FIG. 2. Two adjacent ones of the cells 101 to 112 are electrically connected by a bus bar 19. In FIG. 2, twelve cells are connected in series. However, the manner of connecting cells (series connection or parallel connection) may be determined as appropriate, according to characteristics required of the battery 1.

Although not illustrated in the drawings, a cooling mechanism (e.g., air-cooled type cooling mechanism) may be provided for curbing an excessive temperature rise in the battery assembly. The cells 101 to 112 have substantially the same configuration. Thus, the configuration of the cell 101 will be typically described below.

Each of the cells 101 to 112 corresponds to the "battery" according to this disclosure. However, the unit of calculation of the internal resistance is not limited to cell, but may be two or more cells. Also, the internal resistance may be calculated for the battery assembly as a whole. In this case, the battery assembly corresponds to the "battery" according to the disclosure.

Figure 3:
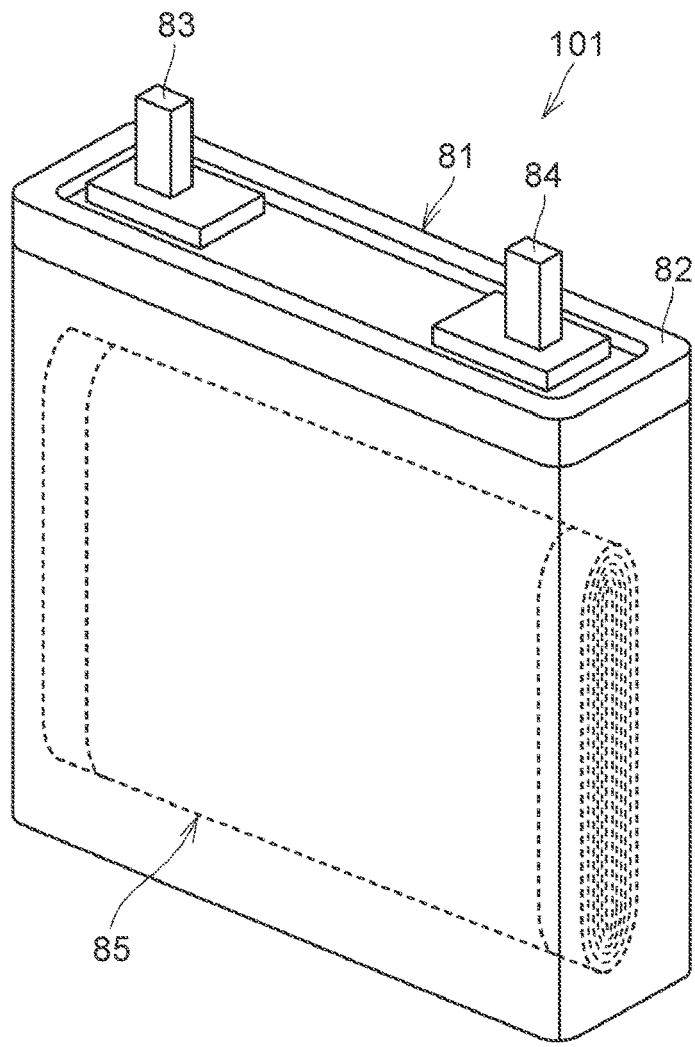
FIG. 3 is a view useful for describing the configuration of a cell in more detail.

FIG. 3 is a view useful for describing the configuration of the cell 101 in more detail. In FIG. 3, the cell 101 is illustrated with the inside seen through its case.

Referring to FIG. 3, the cell 101 has a rectangular battery case 81 (shaped like a generally rectangular parallelepiped). The upper face of the battery case 81 is sealed with a lid body 82. One end of each of a positive terminal 83 and a negative terminal 84 protrudes from the lid body 82 to the outside. The other ends of the positive terminal 83 and negative terminal 84 are respectively connected to an inside positive terminal (not shown) and an inside negative terminal (not shown), in the interior of the battery case 81. An electrode body 85 is housed within the battery case 81. The electrode body 85 is formed by rolling a stacked body in which a positive electrode and a negative electrode are laminated via a separator. An electrolyte is held by the positive electrode, negative electrode, separator, etc.

For the positive electrode, separator, and electrolyte, known structures and materials of positive electrode, separator, and electrolyte of a lithium-ion secondary battery can be respectively used. As one example, a ternary material obtained by substituting nickel and manganese for a part of lithium cobaltite may be used for the positive electrode. For the separator, polyolefin (such as polyethylene or polypropylene) may be used. The electrolyte includes an organic solvent (such as a mixed solvent of DMC (dimethylcarbonate), EMC (ehylmethylcarbonate), and EC (ethylenecarbonate)), lithium salt (such as $LiPF_6$), additive (such as LiBOB (lithiumbis(oxalate)borate) or $Li[PF_2(C_2O_4)_2]$), and so forth.

Calculation of Internal Resistance

The ECU 3 calculates the internal resistance of each of the cells 101 to 112. The internal resistances of the cells 101 to 112 are denoted as R1 to R12, respectively. Here, a method of calculating the internal resistance R1 of the cell 101 will be described by way of example.

Figure 4:
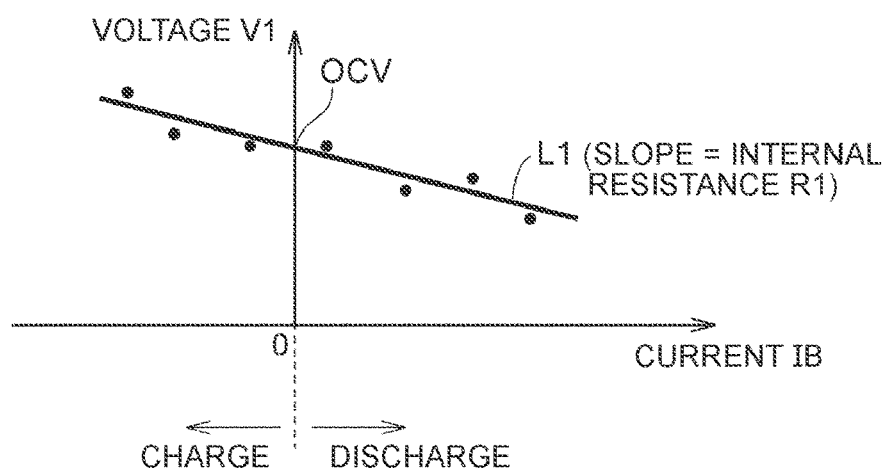
FIG. 4 is a view useful for describing a method of calculating the internal resistance of the cell.

FIG. 4 is a view useful for describing the method of calculating the internal resistance R1 of the cell 101. In FIG. 4, the horizontal axis indicates current IB (=current flowing through the cell 101) that enters and leaves the battery 1. The vertical axis indicates voltage V1 as a closed circuit voltage (CCV) of the cell 101, which is detected with the voltage sensor 21.

The ECU 3 repeatedly measures (synchronously detects) the voltage V1 and current IB of the cell 101 at intervals of a predetermined sampling period (e.g., 100 ms (milliseconds)), and plots the measured values on an I-V characteristic diagram (I-V plot) as shown in FIG. 4. Then, the ECU 3 calculates a regression line L1 indicating the relationship between the voltage V1 and the current IB, through a regression analysis (linear regression computation) using the method of least squares. Thus, the slope of the straight line L1 represents the internal resistance R1 of the cell 101. The internal resistances R2 to R12 of the other cells 102 to 112 may be calculated in a similar manner, though explanation will not be repeated.

Variation in I-V Plot

The vehicle-mounted battery 1 is required to increase its capacity, so as to extend the EV distance (distance over which the vehicle 9 is able to travel with electric power stored in the battery 1) of the vehicle 9. In order to increase the capacity, the ECU 3 according to this embodiment uses the battery 1 in the manner as described below. In the description below, one cell 101 included in the battery 1 will be used, so as to prevent the description from being complicated.

Figure 5:
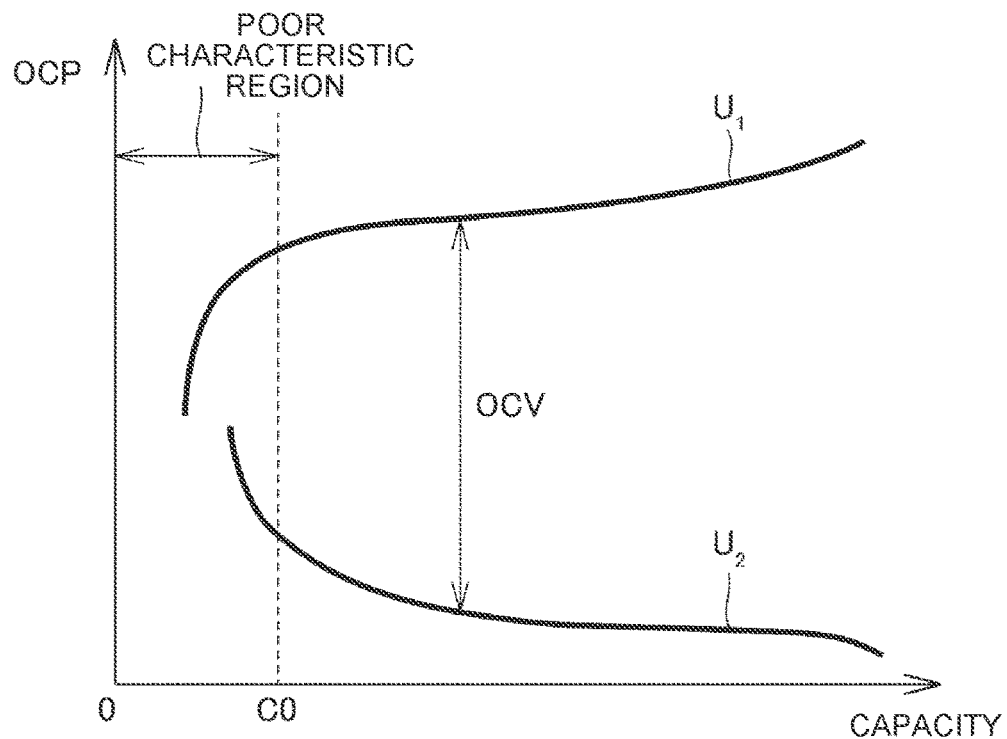
FIG. 5 is a view useful for describing the manner of using the cell in the first embodiment.

FIG. 5 is a view useful for describing the manner of using the cell 101 according to the first embodiment. In FIG. 5, the horizontal axis indicates the capacity of a single electrode (positive electrode or negative electrode) of the cell 101. The vertical axis indicates the open circuit potential (OCP) of the single electrode of the cell 101.

In FIG. 5, the potential of the positive electrode when the battery 1 is in a non-conducting state (no-load state) is denoted as positive-electrode open circuit potential (OCP) $U_1$, and the potential of the negative electrode is denoted as negative-electrode open circuit potential $U_2$. A difference between the positive-electrode open circuit potential $U_1$ and the negative-electrode open circuit potential $U_2$ corresponds to the OCV of the cell 101 (OCV=$U_1$−$U_2$).

As shown in FIG. 5, in a low SOC region (region on the lower capacity side of C0) of the cell 101, the cell 101 has a poor polarization characteristic, and its diffusion resistance is likely to be large. More specifically, in the low SOC region of the cell 101, the positive-electrode open circuit potential $U_1$ changes rapidly, as compared with that in a middle SOC region or high SOC region of the cell 101. Accordingly, in the low SOC region of the cell 101, the amount of variation of the OCV of the cell 101 caused by charge or discharge of the battery 1 (input/output of the current IB) is large. This property is one of battery physical properties, and there exists an SOC region in which the amount of variation of the OCV is large, irrespective of the temperature of the cell 101. In the following description, this low SOC region will also be called "poor characteristic region". In the poor characteristic region, a detection error of the voltage V1 of the cell 101 measured by the voltage sensor 21 is likely to be large. As a result, variations (internal resistance differences) may appear between the internal resistance R1 of the cell 101 calculated by the method described with reference to FIG. 4, and the internal resistances of the remaining cells.

Variations in Internal Resistance

Figure 6:
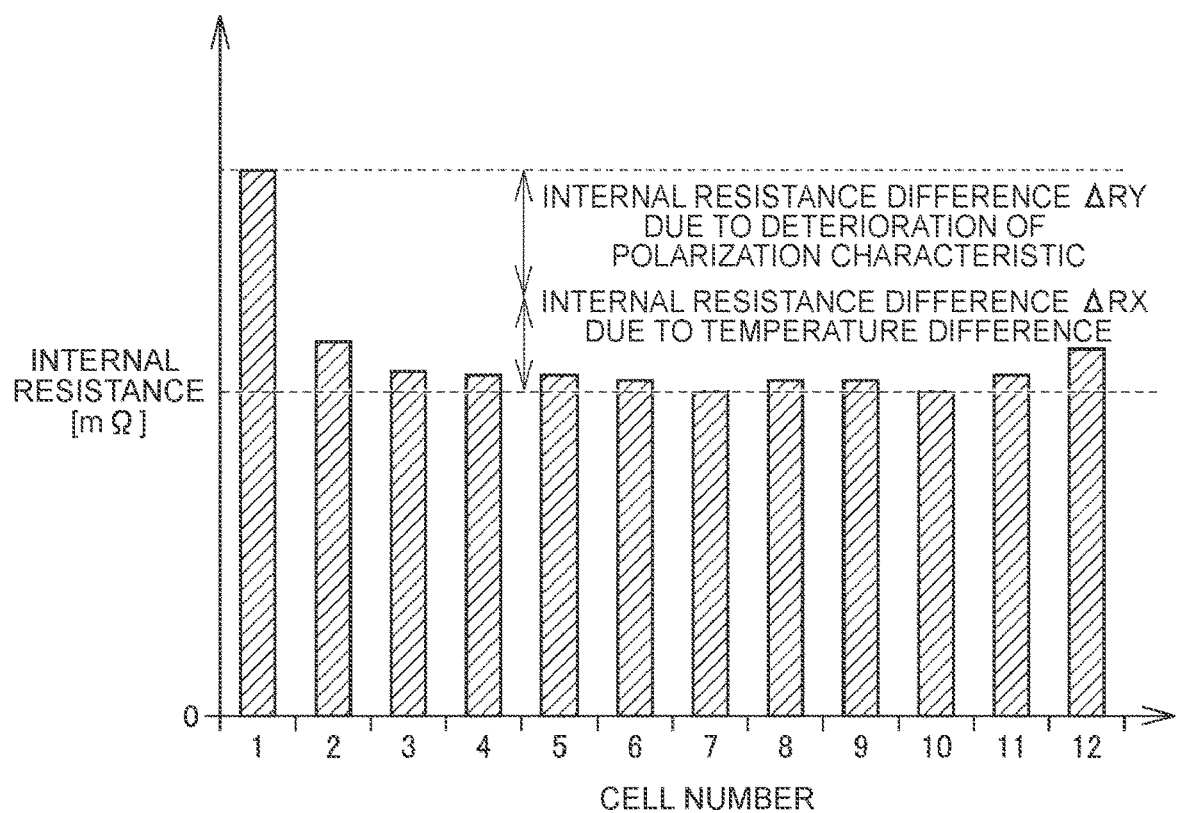
FIG. 6 is a view showing the internal resistances of all cells.

FIG. 6 shows the internal resistances R1 to R12 of the cells 101 to 112. In FIG. 6, the horizontal axis indicates the cell number used for distinguishing the cells 101 to 112 from each other. The vertical axis indicates the internal resistances R1 to R12 of the respective cells 101 to 112.

Referring to FIG. 6, there may be temperature differences among the cells 101 to 112. In the cell arrangement shown in FIG. 2 as one example, the temperatures of the cells 101, 112 located at the opposite ends of the battery assembly are likely to be relatively low, because the cells 101, 112 are cooled by a cooling mechanism of the battery assembly. On the other hand, the temperatures of the cells (e.g., the cells 105 to 108) located in the middle of the battery assembly are likely to be relatively high, because heat generated by the cells is trapped in these cells. Generally, the internal resistance of the secondary battery has temperature dependence; therefore, differences in the internal resistance can be generated among the cells 101 to 112. In FIG. 6, ΔRX denotes an internal resistance difference among the cells 101 to 112 due to temperature differences among the cells 101 to 112.

Furthermore, an internal resistance difference due to an influence of deterioration of the polarization characteristic of the positive electrode may be generated, in the low SOC region (poor characteristic region) of the cell 101, as described above with reference to FIG. 5. In FIG. 6, ΔRY denotes an internal resistance difference ΔRT among the cells 101 to 112 due to deterioration of the polarization characteristic.

As shown in FIG. 6, the internal resistance difference ΔRY may be larger than the internal resistance difference ΔRX, depending on usage conditions of the battery 1. Thus, the internal resistances R1 to R12 of the cells 101 to 112 may not be accurately calculated, simply by taking account of the temperature dependence of the internal resistance.

Figure 7:
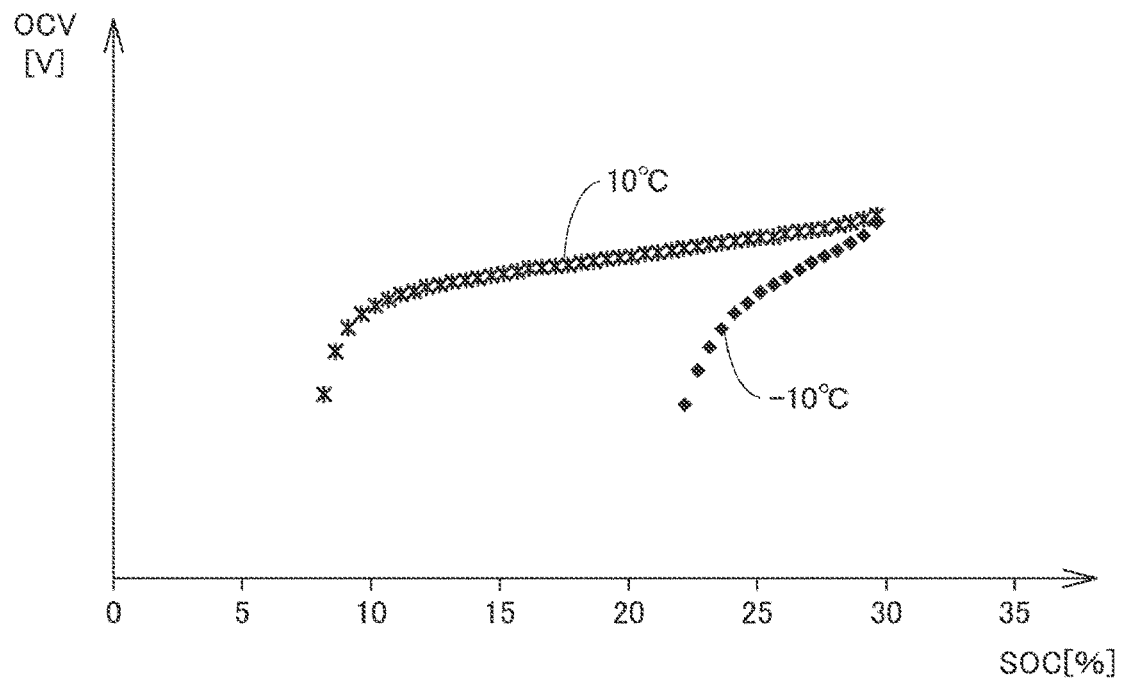
FIG. 7 is a view showing one example of the temperature dependence of active material surface OCV during 1C continuous discharge.

FIG. 7 shows one example of the temperature dependence of the surface (active material surface) OCV of the cell 101. In FIG. 7, the horizontal axis indicates the capacity of the cell 101, and the vertical axis indicates the OCV of the cell 101. In FIG. 7, a curve indicating the SOC (State Of Charge)—surface OCV characteristics of the cell 101 when the temperature of the cell 101 is −10° C., and a curve indicating the SOC—surface OCV characteristics of the cell 101 when the temperature of the cell 101 is 10° C., are shown. The curves indicate measurement results obtained by discharging the cell 101 (actually, a cell equivalent to the cell 101) at a discharge rate of 1C, from a condition where the SOC is equal to 30%.

Referring to FIG. 7, the curve indicating measurement results at −10° C. is located on the right-hand side (namely, on the higher SOC side) of the curve indicating measurement results at 10° C. This follows that the temperature of the cell 101 has an influence on whether the SOC of the cell 101 is within the poor characteristic region. Further, influences can also be given by the charge/discharge history of the cell 101, more specifically, the SOC of the cell 101, the magnitude of current flowing through the cell 101, energization time (a length of time for which current flows continuously) of the cell 101, as well as the temperature of the cell 101. If the temperatures of adjacent two cells of the cells 101 to 112 are equal, no internal resistance difference arises between the two cells. However, in fact, temperature differences can arise between the cells 101 to 112; therefore, internal resistance differences are generated due to the temperature differences, and, consequently, the degree of deterioration of the polarization characteristic differs from one cell to another. Then, there may arise a situation where the SOC of one of two adjacent cells is within the poor characteristic region, whereas the SOC of the other cell is outside the poor characteristic region, for example. Thus, it is difficult to easily determine whether the cell 101 is within the poor characteristic region or outside the poor characteristic region (for example, make this determination simply based only on the SOC of the cell 101). In other words, it is difficult to estimate when the cell 101 enters the poor characteristic region, and leaves the poor characteristic region.

Thus, in this embodiment, the ECU 3 calculates the internal resistance of each of the cells 101 to 112 a plurality of times, and determines whether the SOC of the cell in question is within the poor characteristic region, based on the calculation results. Then, when the SOC of any cell of the cells 101 to 112 is within the poor characteristic region, abnormality diagnosis of the battery 1 based on the internal resistances R1 to R12 of the cells 101 to 112 is not carried out.

Analysis of I-V Plot

In the following, with regard to two cells (the cell 101 (first cell) and the cell 102 (second cell)) among the twelve cells, for example, a method of analyzing the I-V plot of each of the cells 101, 102 will be described. It is assumed that the SOC of the cell 102 is outside the poor characteristic region, and the SOC of the cell 101 is within the poor characteristic region. The ECU 3 determines whether the SOC of each of the cells 101, 102 is within the poor characteristic region, by analyzing the I-V plot of the cell 101, 102.

Figure 8:
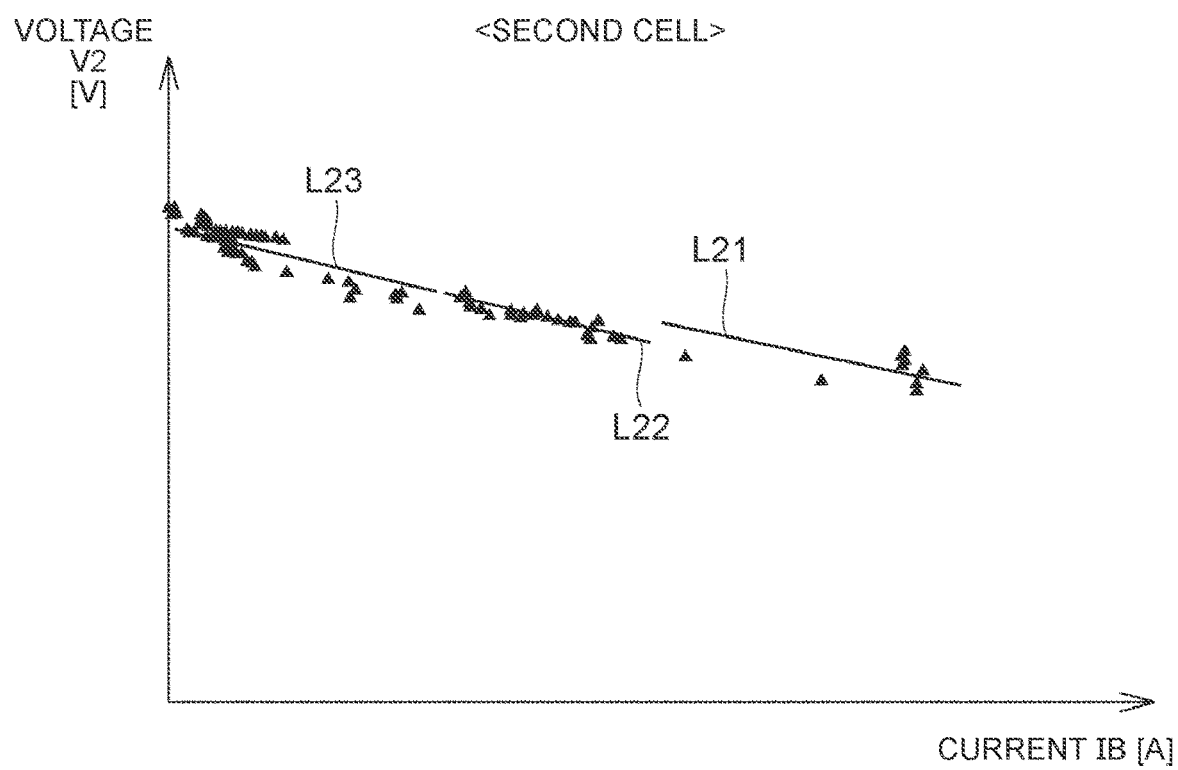
FIG. 8 is a view showing one example of an I-V plot of a second cell in the first embodiment.

FIG. 8 shows one example of the I-V plot of the cell 102 in the first embodiment. In FIG. 8, and FIG. 9, FIG. 11 and FIG. 12 which will be described later, the horizontal axis indicates current IB, and the vertical axis indicates the closed circuit voltage (voltage V1 or voltage V2) of the cell.

Referring to FIG. 8, in this example, the sampling period of the voltage V2 and current IB of the cell 102 is 100 ms. Also, the number of times of sampling is 300 times. Through linear regression of the first 100 sampling results (combinations of V2 and IB), out of the total 300 times of sampling, a regression line L21 is obtained. Then, the first internal resistance $R_2(1)$ of the cell 102 is calculated, from the slope of the regression line L21.

Similarly, a regression line L22 is obtained from the results of the following 100 times of sampling (from the 101st sampling to the 200th sampling). The second internal resistance $R_2(2)$ of the cell 102 is calculated from the slope of the regression line L22. Further, a regression line L23 is obtained from the results of the last 100 times of sampling (from the 201st sampling to the 300th sampling). The third internal resistance $R_2(3)$ of the cell 102 is calculated from the slope of the regression line L23. Then, the calculation results ($R_2(1)$ to $R_2(3)$) of the three internal resistances are compared with each other.

In this connection, the results of 100 times of sampling (e.g., from the first sampling to the 100th sampling), out of the total 300 times of sampling, correspond to the "first detection group" according to this disclosure, and the results of other 100 times of sampling (e.g., from the 101st sampling to the 200th sampling) correspond to the "second detection group" according to the disclosure.

In the cell 102, variations between the internal resistances $R_2(1)$ to $R_2(3)$ calculated at three different times are small, as shown in FIG. 8. More specifically, a difference between the maximum resistance and minimum resistance among the internal resistances $R_2(1)$ to $R_2(3)$ is equal to or smaller than a predetermined reference value. This means that the cell 102 had no influence (or a sufficiently small influence) of deterioration of the polarization characteristic, during the total 300 times of sampling.

Figure 9:
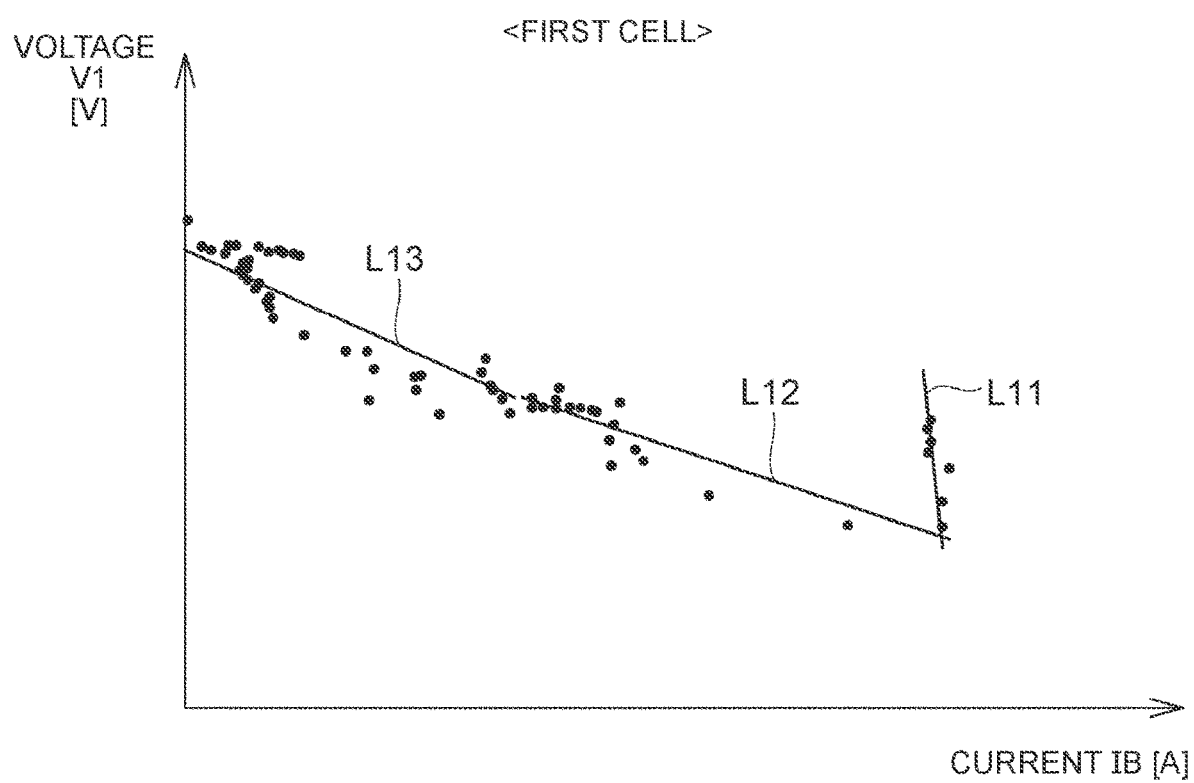
FIG. 9 is a view showing one example of an I-V plot of a first cell in the first embodiment.

FIG. 9 shows one example of the I-V plot of the cell 101 according to the first embodiment. Referring to FIG. 9, with regard to the cell 101, the results of the 300 times of sampling are divided into three groups, and three regression lines L11 to L13 are obtained, as in the case of the cell 102. Then, the internal resistances $R_1(1)$ to $R_1(3)$ are respectively calculated from the slopes of the regression lines L11 to L13.

In the cell 101, variations between the internal resistances $R_1(1)$ to $R_1(3)$ calculated at three different times are large. In the example shown in FIG. 9, the internal resistance $R_1(1)$ calculated for the first time is significantly larger than the internal resistances $R_1(2)$, $R_1(3)$ calculated for the second time and the third time, respectively. This means that the cell 101 had an influence of deterioration of the polarization characteristic, during the first 100 times of sampling.

In this embodiment, when any one of the cells 101 to 112 has a large variation between the calculation results of the three internal resistances $R_i(1)$ to $R_i(3)$ (i=1 to 12), the ECU 3 determines that the calculation accuracy of the internal resistance is low. Then, the ECU 3 does not perform an abnormality diagnosis on the battery 1, because the internal resistance of which the calculation accuracy is low is not suitable for use in the abnormality diagnosis of the battery 1.

Calculation Flow of Internal Resistance

Figure 10:
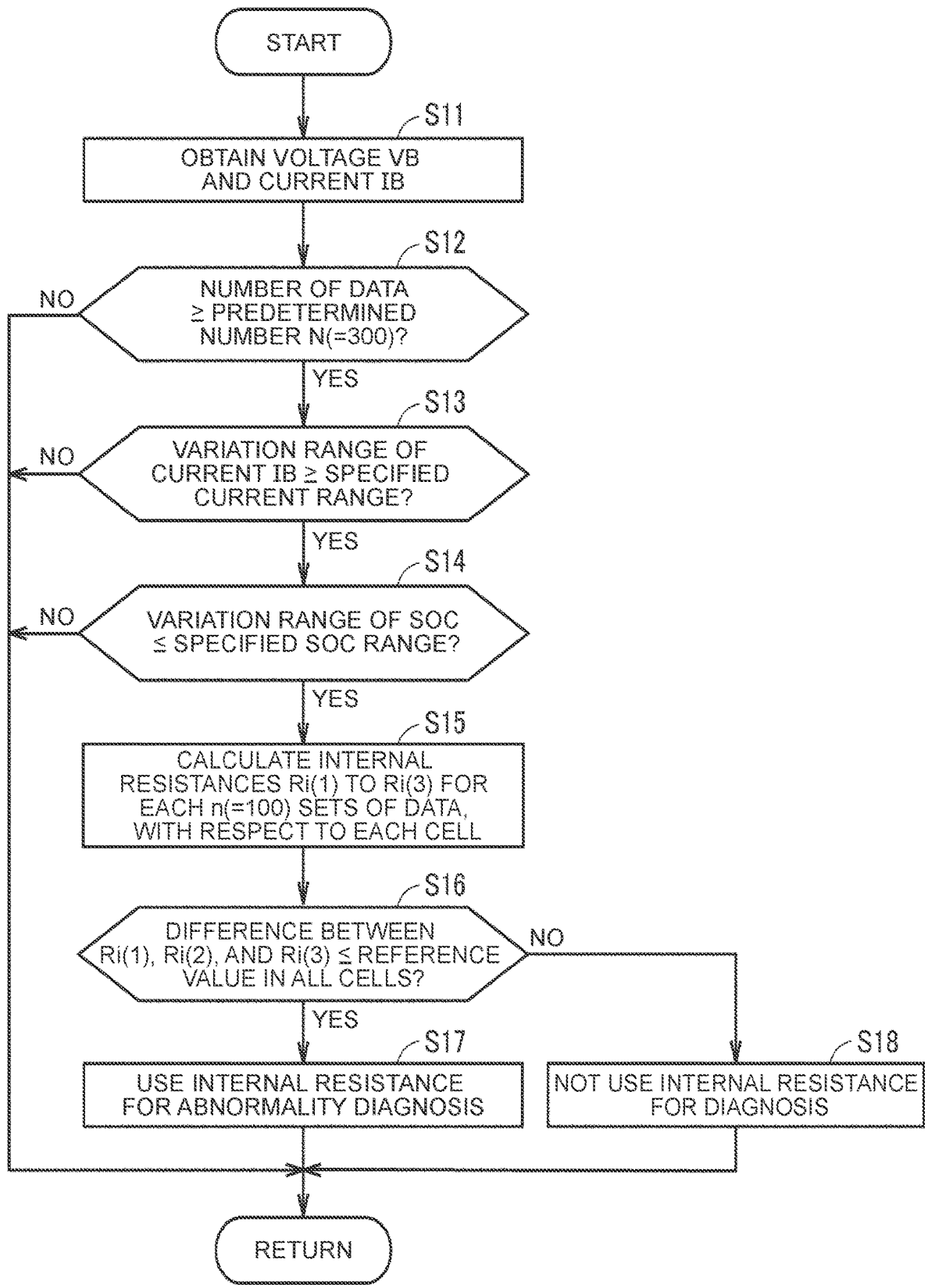
FIG. 10 is a flowchart illustrating an internal resistance calculation routine in the first embodiment.

FIG. 10 is a flowchart illustrating an internal resistance calculation routine according to the first embodiment. Control routines illustrated in the flowcharts shown in FIG. 10 and FIG. 13 (which will be described later) are called for from a main routine (not shown) and executed at intervals of a given control period. While each step included in these flowcharts is basically implemented through software processing by the ECU 3, it may also be implemented by a dedicated hardware (electric circuit) produced in the ECU 3.

Referring to FIG. 10, in step S11, the ECU 3 obtains (detects at substantially the same time) the voltage VB and the current IB from the voltage sensor 21 and the current sensor 22, respectively, with respect to each of the cells 101 to 112 included in the battery 1. The ECU 3 stores the obtained voltage VB and current IB in the memory 32.

In steps S12 to S14, the ECU 3 whether data (combinations of the voltage VB and current IB) stored in the memory 32 meets predetermined criteria. The criteria are used for determining whether the obtained data is suitable for calculation of the internal resistance, and include a first criterion, a second criterion, and a third criterion, for example.

The first criterion is that the number of the combinations of the voltage VB and current IB (the number of pieces of data) stored in the memory is equal to or larger than a predetermined value (step S12). If the number of pieces of data is excessively small, the approximation accuracy of linear regression may be reduced. The predetermined value may be set to the number of pieces of data (e.g., 300 sets) that can ensure desired approximation accuracy.

The second criterion is that, in the predetermined number of combinations (300 sets) of the voltage VB and current IB, the range of variation of the current IB (e.g., a difference between the maximum current and the minimum current) is equal to or larger than a specified current range (step S13). If points representing the current IB concentrate in a particular current range, the accuracy (approximation accuracy) of linear regression may be reduced. To improve the calculation accuracy of the slope (=internal resistance) of the regression line, it is preferable that points representing the current IB spread over as wide a range as possible. Thus, the specified current range can be set to a range that can ensure a desired approximation accuracy, based on experimental results obtained in advance.

The third criterion is that the range of variation of the SOC of the battery 1 (e.g., a difference between the highest SOC and the lowest SOC) during a period in which the predetermined number of combinations (300 sets) of the voltage VB and current IB are measured is equal to or smaller than a specified SOC range. As shown in FIG. 4, the OCV of the battery 1 corresponds to the y-intercept of the regression line (point of intersection with the voltage axis). Since there is a correlative relationship between the OCV of the battery 1 and the SOC, the OCV of the battery 1 varies, and the y-intercept of the regression line changes, as the SOC of the battery 1 varies. When variations in the y-intercept of the regression line among the predetermined number of pieces of data are large, it means that data representing different states of the battery 1 are mixed in the data subjected to linear regression. Accordingly, the upper limit is provided for the range of variation of the SOC of the battery 1, based on experimental results obtained in advance, and linear regression computation is performed when the range of variation of the SOC is within the upper limit (within the specified SOC range). The SOC of the battery 1 can be estimated from the cell voltage and the current IB, according to a flowchart (not shown).

When any of the first to third criteria is not met (NO in any of steps S12 to S14), the ECU 3 returns to the main routine. As a result, step S11 is executed again, and the voltage VB and the current IB are newly obtained. When all of the first to third criteria are met (YES in all of steps S12 to S14), the ECU 3 proceeds to step S15.

In step S15, the ECU 3 divides 300 sets of data into three groups each containing 100 sets, with respect to each of the cells 101 to 112, for example, and calculates the internal resistances $R_i(1)$ to $R_i(3)$ (i=1 to 12) for the respective groups. The calculation method has been described in detail with reference to FIG. 8 and FIG. 9, and thus will not be repeatedly described herein.

In step S16, the ECU 3 compares the resistances $R_i(1)$ to $R_i(3)$ of each of the cells 101 to 112 with each other, for each cell. More specifically, the ECU 3 determines whether a resistance difference ($R_i$ max–$R_i$ min) between the maximum resistance $R_i$ max and the minimum resistance $R_i$ min of the resistances $R_i(1)$ to $R_i(3)$ is equal to or smaller than a reference value, with respect to each of the cells 101 to 112.

When the resistance difference ($R_i$ max–$R_i$ min) between the maximum resistance $R_i$ max and the minimum resistance $R_i$ min is equal to or smaller than the reference value, with respect to all of the cells 101 to 112 (YES in step S16), the ECU 3 determines that the internal resistances $R_i(1)$ to $R_i(3)$ calculated in step S15 can be used for abnormality diagnosis of the battery 1 (step S17). The abnormality diagnosis of the battery 1 is performed according to another flowchart (not shown). The ECU 3 can use the slope of the straight line obtained through linear regression of the predetermined number of combinations (300 sets in this example) of the voltage VB and current IB, as the internal resistance of the cell.

On the other hand, when the resistance difference ($R_i$ max–$R_i$ min) of any of the cells 101 to 112 is larger than the reference value (NO in step S16), the ECU 3 determines that the internal resistances $R_i(1)$ to $R_i(3)$ of all of the cells 101 to 112 are not used for abnormality diagnosis of the battery 1, since the internal resistances $R_i(1)$ to $R_i(3)$ calculated in step S15 are not suitable for use in the abnormality diagnosis of the battery 1 (step S18).

As described above, in the first embodiment, the internal resistance is calculated three times for each of the cells 101 to 112, and the results of calculation are compared with each other. When there is a variation in the three calculation results of the internal resistance, the variation may derive from deterioration of the polarization characteristic. Accordingly, the ECU 3 does not employ the internal resistance as a parameter used for abnormality diagnosis. Thus, according to the first embodiment, the abnormality diagnosis can be appropriately performed, based on the calculation results of the internal resistance of the battery 1.

In this embodiment, the internal resistances of the cells 101 to 112 are used for the abnormality diagnosis of the battery 1. However, the use of the internal resistances of the cells 101 to 112 is not limited to the abnormality diagnosis, but the internal resistance may be used for calculation of the OCV of each cell (OCV=CCV–IB×R). In another example, the internal resistance may be used for setting of the output electric power (the upper-limit electric power value Wout of the output power) from the battery 1.

Second Embodiment

In the first embodiment, the ECU 3 is configured to determine, depending on the magnitude of variation in the resistance of the battery 1, whether the internal resistance is used for evaluation or control of the battery 1. In the second embodiment, the ECU 3 is configured to determine whether the internal resistance of the battery 1 is calculated according to variations in the current IB that passes through the battery 1. The overall configuration of the vehicle 9 and the battery system 90 in the second embodiment is similar to the configuration shown in FIG. 1, and thus will not be repeatedly described.

Analysis of I-V Plot

Figure 11:
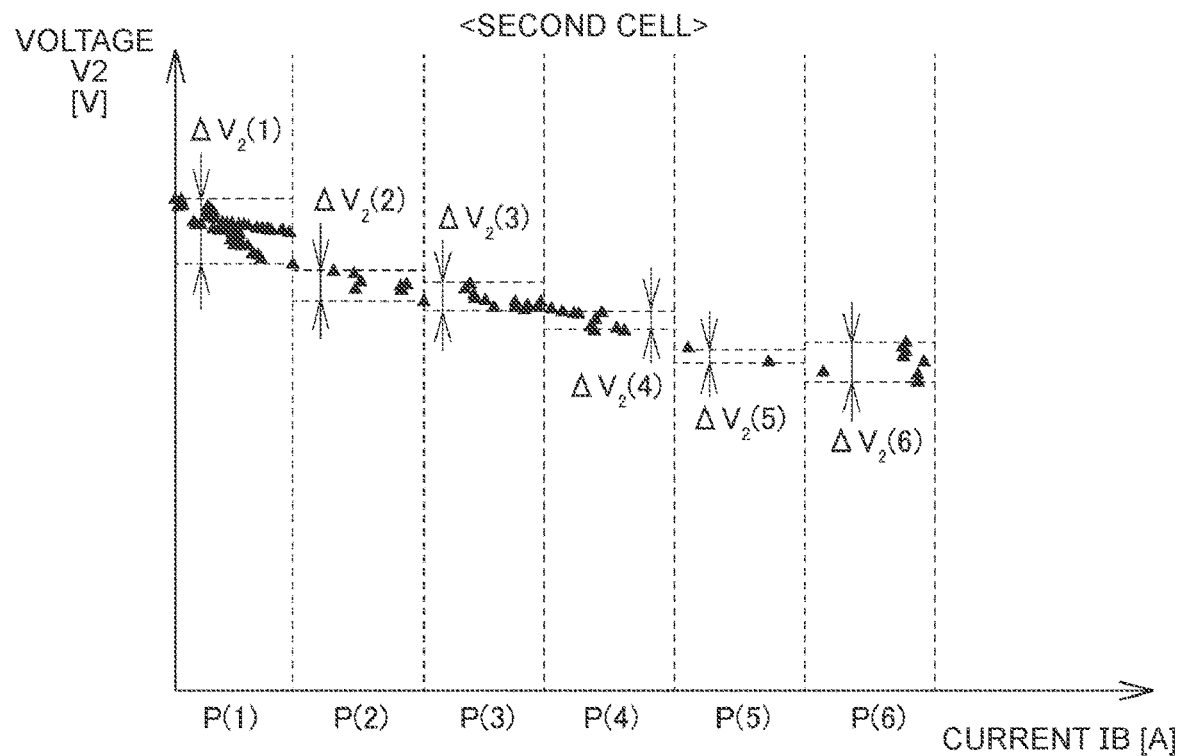
FIG. 11 is a view showing one example of an I-V plot of a second cell in a second embodiment.
Figure 12:
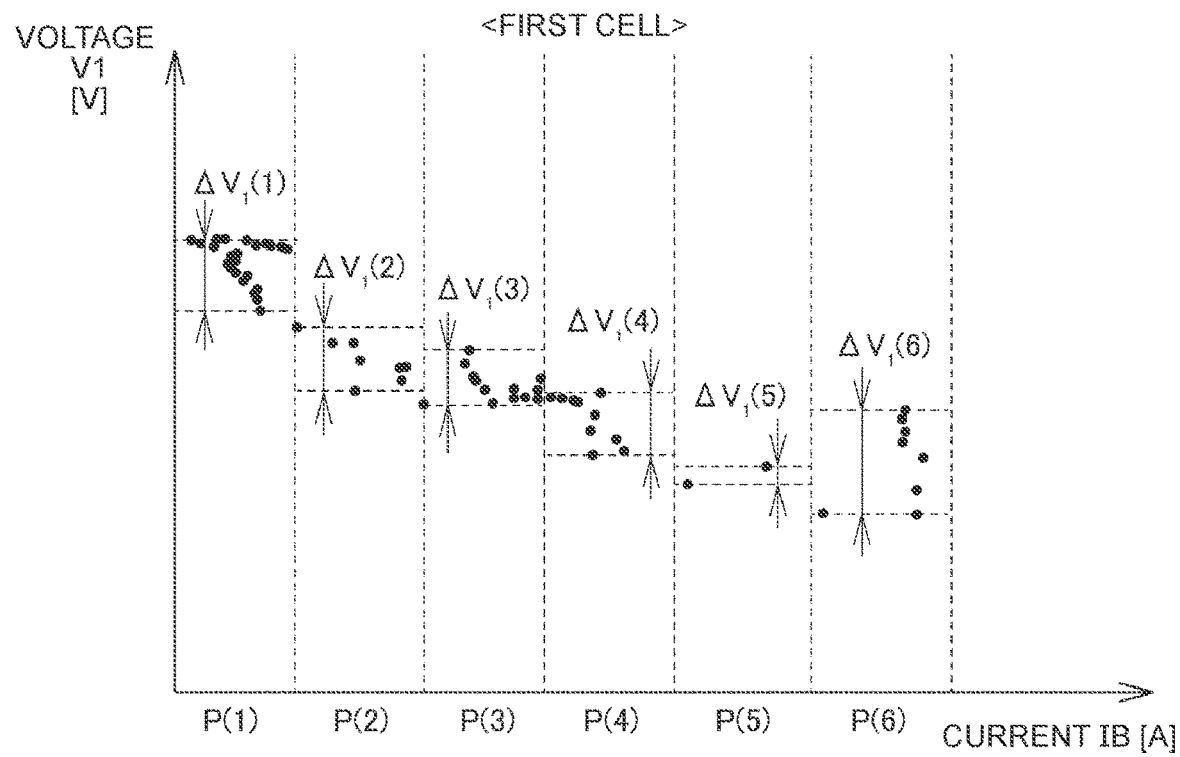
FIG. 12 is a view showing one example of an I-V plot of a first cell in the second embodiment.

FIG. 11 shows one example of an I-V plot of the cell 102 in the second embodiment. FIG. 12 shows one example of the I-V plot of the cell 101 in the second embodiment.

Referring initially to FIG. 11, in the second embodiment, the ECU 3 classifies the results of the total 300 times of sampling of the voltage V2 and current IB of the cell 102, into some groups corresponding to ranges (current ranges) in which the current IB is included. Each current range may be set to a range of 50 A, for example. In FIG. 11 and FIG. 12, six current ranges P(1) to P(6) are provided.

The ECU 3 classifies points representing the voltage, into six sections corresponding to the current ranges P(1) to P(6), and calculates a difference (voltage difference) between the maximum voltage and minimum voltage in each of the current ranges P(1) to P(6). Namely, where $\Delta V_n(k)$ denotes a voltage difference in the k-th (k=1 to 6) current range P(k) of the n-th (n=1 to 12) cell, the voltage difference $\Delta V_n(k)$ is expressed by the following equation (1), using the maximum voltage $V_{n,max}(k)$ and the minimum voltage $V_{n,min}(k)$ in the current range P(k).

$$\Delta V_n(k) = V_{n,max}(k) - V_{n,min}(k) \tag{1}$$

The ECU 3 determines whether there is any current range P(k) in which the voltage difference $\Delta V_n(k)$ exceeds a predetermined reference value, with respect to each of the cells 101 to 112. In the cell 102 shown in FIG. 11, the voltage differences $\Delta V_2(k)$ in all current ranges P(k) do not exceed the reference value. On the other hand, in the cell 101 shown in FIG. 12, the voltage difference $\Delta V_1(6)$ in the sixth current range P(6) exceeds the reference value.

When there is any current range P(k) in which the voltage difference $\Delta V_n(k)$ exceeds the reference value, in any one cell of the cells 101 to 112, the cell may be charged or discharged in the poor characteristic region. Accordingly, the ECU 3 does not calculate the internal resistances R1 to R12, based on the I-V plots of the cells 101 to 112. In other words, when the voltage difference $\Delta V_n(k)$ is equal to or smaller than the reference value, in all of the current ranges P(k) of all of the cells 101 to 112, the ECU 3 calculates the internal resistances R1 to R12, based on the I-V plots of the cells 101 to 112.

Calculation Flow of Internal Resistance

FIG. 13 is a flowchart illustrating an internal resistance calculation routine according to the second embodiment. Referring to FIG. 13, steps S21 to S24 are substantially identical with steps S11 to S14 of the first embodiment, and therefore, will not be repeatedly described.

When any of the first to third criteria is not met (NO in any of steps S22 to S24), the ECU 3 returns to the main routine. When all of the first to third criteria are met (YES in all of steps S22 to S24), the ECU 3 proceeds to step S25.

In step S25, the ECU 3 classifies the combinations (VB, IB) of the voltage VB and current IB stored in the memory 32, into the respective current ranges P(k), and calculates the voltage difference $\Delta V_n(k)$ for each current range P(k), with respect to each of the cells 101 to 112 (see Eq. (1) above).

The calculation method has been described in detail with reference to FIG. 11 and FIG. 12, and therefore, will not be repeatedly described.

In step S26, the ECU 3 determines whether the SOC of the battery 1 is within the poor characteristic region. When the SOC of the battery 1 is equal to or lower than a boundary value (corresponding to C0 shown in FIG. 5) that separates the inside of the poor characteristic region from the outside (YES in step S26), the ECU 3 proceeds to step S29. The boundary value may be set to a value at which an influence of deterioration of the polarization characteristic definitely appears irrespective of the temperature TB or charge/discharge history (such as the energization time) of the battery 1. When the SOC of the battery 1 is within the poor characteristic region, the ECU 3 determines that it will not calculate the internal resistance of each of the cells 101 to 112, since the internal resistance of each cell 101 to 112, even if it is calculated, is highly likely to be not suitable for abnormality diagnosis of the battery 1.

On the other hand, when the SOC of the battery 1 exceeds the boundary value (NO in step S26), the SOC of the battery 1 is outside the poor characteristic region. Accordingly, the ECU 3 determines that it can perform abnormality diagnosis of the battery 1, and proceeds to step S27.

In step S27, the ECU 3 determines whether the voltage difference $\Delta V_n(k)$ is equal to or smaller than a reference value (e.g., 10 mV), in all of the current ranges P(k) (k=1 to 6), with respect to each of the cells 101 to 112. When there is any current range P(k) in which the voltage difference $\Delta V_n(k)$ is larger than the reference value (NO in step S27), the ECU 3 does not calculate the internal resistance (step S29), and returns to the main routine. When the voltage differences $\Delta V_n(k)$ in all of the current ranges P(k) are equal to or smaller than the reference value (YES in step S27), the ECU 3 proceeds to step S28.

In step S28, the ECU 3 calculates the internal resistance of each of the cells 101 to 112 (internal resistance calculation). Then, the ECU 3 performs an abnormality diagnosis of the battery 1, based on the internal resistances thus calculated.

As described above, in the second embodiment, the ECU 3 calculates the voltage difference $\Delta V_n$ in each current range P(k), for each of the cells 101 to 112, and determines whether the voltage difference $\Delta V_n(k)$ does not exceed the reference value. When the voltage difference $\Delta V_n(k)$ exceeds the reference value, the voltage variation may derive from deterioration of the polarization characteristic. Accordingly, the ECU 3 does not calculate the internal resistance based on the voltage VB and the current IB. As a result, no abnormality diagnosis of the battery 1 is performed based on the internal resistances of the cells 101 to 112. According to the second embodiment, it is possible to improve the calculation accuracy of the internal resistance of the battery 1, by excluding, in advance, data influenced by deterioration of the polarization characteristic.

It is to be understood that the embodiments described herein are exemplary in all points, and not restrictive. The scope of this disclosure is indicated by the appended claims, rather than the above description of the embodiments, and is intended to include all changes within the meaning and range of equivalents to the claims.

What is claimed is:

1. A battery system comprising:
a battery;
a voltage sensor configured to detect a voltage of the battery;
a current sensor configured to detect a current that passes through the battery; and
a controller configured to perform internal resistance calculation to calculate an internal resistance of the battery, and configured to execute an abnormality diagnosis based on a result of the internal resistance calculation, wherein:
the internal resistance calculation comprises obtaining a regression line through a regression analysis of a current—voltage plot obtained from the voltage sensor and the current sensor, and calculating the internal resistance from a slope of the regression line;
the controller is configured to calculate a first internal resistance through the internal resistance calculation based on a first detection group of detection values of the voltage and the current that are detected a plurality of times, and calculate a second internal resistance through the internal resistance calculation based on a second detection group of detection values of the voltage and the current that are detected a plurality of times; and
the controller is configured to execute the abnormality diagnosis based on the internal resistance when a resistance difference between the first internal resistance and the second internal resistance is smaller than a reference value, and is configured not to execute the abnormality diagnosis based on the internal resistance when the resistance difference is larger than the reference value.

2. A battery system comprising:
a battery;
a voltage sensor configured to detect a voltage of the battery;
a current sensor configured to detect a current that passes through the battery; and
a controller configured to perform internal resistance calculation to calculate an internal resistance of the battery, and configured to execute a predetermined operation based on a result of the internal resistance calculation, wherein:
the internal resistance calculation comprises obtaining a regression line through a regression analysis of a current—voltage plot obtained from the voltage sensor and the current sensor, and calculating the internal resistance from a slope of the regression line;
the controller is configured to calculate a first internal resistance through the internal resistance calculation based on a first detection group of detection values of the voltage and the current that are detected a plurality of times, and calculate a second internal resistance through the internal resistance calculation based on a second detection group of detection values of the voltage and the current that are detected a plurality of times; and
the controller is configured to execute the predetermined operation when a resistance difference between the first internal resistance and the second internal resistance is smaller than a reference value, and is configured not to execute the predetermined operation when the resistance difference is larger than the reference value wherein:
the controller is configured to determine whether a first criterion, a second criterion, and a third criterion are met, and newly execute detection of the voltage and the current, when any of the first criterion, the second criterion, and the third criterion is not met;

the first criterion is that the number of combinations of the detection values of the voltage and the current is equal to or larger than a predetermined value;

the second criterion is that a range of variation of the detection values of the current, in the combinations of the detection values of the voltage and the current, is equal to or larger than a predetermined value; and the third criterion is that a range of variation of a state of charge of the battery during detection of the voltage and the current is equal to or smaller than a predetermined value.

3. A battery system comprising:
a battery;
a voltage sensor configured to detect a voltage of the battery;
a current sensor configured to detect a current that passes through the battery; and
a controller configured to perform internal resistance calculation to calculate an internal resistance of the battery, wherein:
the internal resistance calculation comprises obtaining a regression line through a regression analysis of a current—voltage plot obtained from the voltage sensor and the current sensor, and calculating the internal resistance from a slope of the regression line;
the controller is configured to calculate a voltage difference between a maximum voltage and a minimum voltage, out of voltages detected a plurality of times, with respect to each of a plurality of current ranges in the current—voltage plot; and
the controller is configured to perform the internal resistance calculation when the voltage difference is smaller than a reference value in all of the current ranges, and is configured not to perform the internal resistance calculation when the voltage difference is larger than the reference value in any of the current ranges.

4. The battery system according to claim 3, wherein:
the controller is configured to determine whether a first criterion, a second criterion, and a third criterion are met, and newly execute detection of the voltage and the current, when any of the first criterion, the second criterion, and the third criterion is not met;
the first criterion is that the number of combinations of detection values of the voltage and the current is equal to or larger than a predetermined value;
the second criterion is that a range of variation of the detection values of the current, in the combinations of the detection values of the voltage and the current, is equal to or larger than a predetermined value; and
the third criterion is that a range of variation of a state of charge of the battery during detection of the voltage and the current is equal to or smaller than a predetermined value.

* * * * *